(12) United States Patent
Kim

(10) Patent No.: US 6,509,658 B1
(45) Date of Patent: Jan. 21, 2003

(54) DEVICE FOR THE AUTOMATIC SHUT-OFF OF EQUIPMENT'S STAND-BY POWER

(75) Inventor: Hyung-Kwang Kim, 1201 Hans Tower, 46-5 Guro 5-dong, Guro-ku, Seoul 152-055 (KR)

(73) Assignees: Jinnes Technologies Inc., Santa Clara, CA (US); Hyung-Kwang Kim, Seoul (KR)

( * ) Notice: Subject to any disclaimer, the term of this patent is extended or adjusted under 35 U.S.C. 154(b) by 0 days.

(21) Appl. No.: 09/456,987

(22) Filed: Dec. 7, 1999

(30) Foreign Application Priority Data

Dec. 16, 1998 (KR) .............................. 98-55394

(51) Int. Cl.⁷ .................................. H02J 9/00
(52) U.S. Cl. ................... 307/117; 361/166; 315/159; 250/214 AL
(58) Field of Search ................. 307/117; 361/166, 361/170, 173, 174, 195, 3, 167; 250/214 AL, 200, 206, 208.1, 214 R, 214 AG, 214 LS, 551; 315/159, 153, 155, 312, 158, 360

(56) References Cited

U.S. PATENT DOCUMENTS

| | | | | |
|---|---|---|---|---|
| 4,236,084 A | * | 11/1980 | Gingras | 307/117 |
| 4,356,405 A | * | 10/1982 | Russo | 307/117 |
| 4,585,339 A | * | 4/1986 | Senoo | 307/117 |
| 4,733,103 A | * | 3/1988 | Itoh et al. | 307/117 |
| 4,771,186 A | * | 9/1988 | Basso | 307/117 |
| 4,843,283 A | * | 6/1989 | Chen | 307/117 |
| 5,077,484 A | * | 12/1991 | Tsai et al. | 307/117 |
| 5,099,384 A | | 3/1992 | Chin | |
| 5,117,325 A | | 5/1992 | Dunk et al. | |
| 5,121,284 A | | 6/1992 | Onodera et al. | |
| 5,257,156 A | | 10/1993 | Kirkpatrick | |
| 5,262,679 A | | 11/1993 | Schweitzer, III et al. | |
| 5,534,735 A | * | 7/1996 | Baba et al. | 307/117 |
| 5,572,074 A | * | 11/1996 | Standley | 307/117 |
| 5,592,033 A | * | 1/1997 | Gold | 307/117 |
| 5,623,186 A | * | 4/1997 | Archdekin | 315/360 |
| 5,629,569 A | * | 5/1997 | Janda | 307/117 |
| 5,706,155 A | * | 1/1998 | Neiger et al. | 361/45 |
| 5,793,125 A | * | 8/1998 | Tarng | 307/117 |
| 5,894,175 A | * | 4/1999 | Berlin et al. | 307/117 |
| 5,895,986 A | * | 4/1999 | Walters et al. | 307/117 |
| 6,078,111 A | * | 6/2000 | Sun et al. | 307/117 |
| 6,153,948 A | * | 11/2000 | Cogan et al. | 307/117 |
| 6,172,484 B1 | * | 1/2001 | Jones | 307/117 |
| 6,191,568 B1 | * | 2/2001 | Poletti | 315/360 |
| 6,396,166 B1 | * | 5/2002 | Kim | 307/112 |

FOREIGN PATENT DOCUMENTS

GB 2345809 * 7/2000 ............. H02J/9/00

* cited by examiner

Primary Examiner—Brian Sircus
Assistant Examiner—Roberto J. Rios
(74) Attorney, Agent, or Firm—Lee & Hong

(57) ABSTRACT

The present invention relates to a device for the automatic shut-off of equipment's stand-by power which can switch on or off the power for a set of electric and electronic appliances and can reduce the power consumption in a state of waiting for use.

The invention provides a device for the automatic shut-off of equipment's stand-by power which particularly comprises a first relay for switching contacts of the first line, a second relay for switching contacts of the second line, and a power switching controller for detecting whether the light is present and for sequently switching the contact states of the first relay and the second relay depending on the result of the light detection to thereby allow or cut off the commercial alternating current through the first and second lines.

8 Claims, 3 Drawing Sheets

DEVICE FOR THE AUTOMATIC SHUT-OFF OF EQUIPMENT'S STAND-BY POWER

FIELD OF THE INVENTION

The present invention relates to a device for the automatic shut-off of equipment's stand-by power and more particularly a device for the automatic shut-off of equipment's stand-by power which can switch on or off the power for a set of electric and electronic appliances in a state of waiting for use.

BACKGROUND OF THE INVENTION

Generally the commercial alternating current is supplied to the individual electric and electronic appliances via the plugs. Those electric and electronic appliances use the commercial alternating current supplied through the plugs as the power source, and the alternating current to the appliances is shut off by operating the power switches allocated to the individual appliances during the waiting or non-service time. In such a conventional case of cutting power with plugs still inserted in the receptacles, a significant amount of energy can be lost because many of modern electric appliances consume some electric current supplied through the plugs for quick start-up even during the sleeping hours at night. Thus, it is recently recommended that the plugs for electric appliances not in service be detached to save energy. It is very inconvenient and troublesome to disconnect all the plugs of electric and electronic appliances connected to the commercial alternating line, specially when the number of those appliances is large.

SUMMARY OF THE INVENTION

The object of the present invention is to provide a device for the automatic shut-off of equipment's stand-by power which is operated based on photosensitivity in a reliable manner so that supply of alternating current to the electric and electronic apparatuses is conducted in the daytime but automatically cut off specially at night or during the sleeping hours.

The above object is achieved by a device for the automatic shut-off of equipment's stand-by power according to the present invention, which devise includes the first and second lines for supplying the commercial alternating current, the first and second relays for switching the contacts of the first and a second lines respectively and a power switching controller for successively switching the contacting states of the first and second relays depending on the presence/absence of the light detected to thereby allow or shut off the commercial alternating current through the first and second lines.

DETAILED DESCRIPTION OF THE INVENTION

A preferred embodiment of the invention will be described with reference to the attached drawings.

Figure 1:
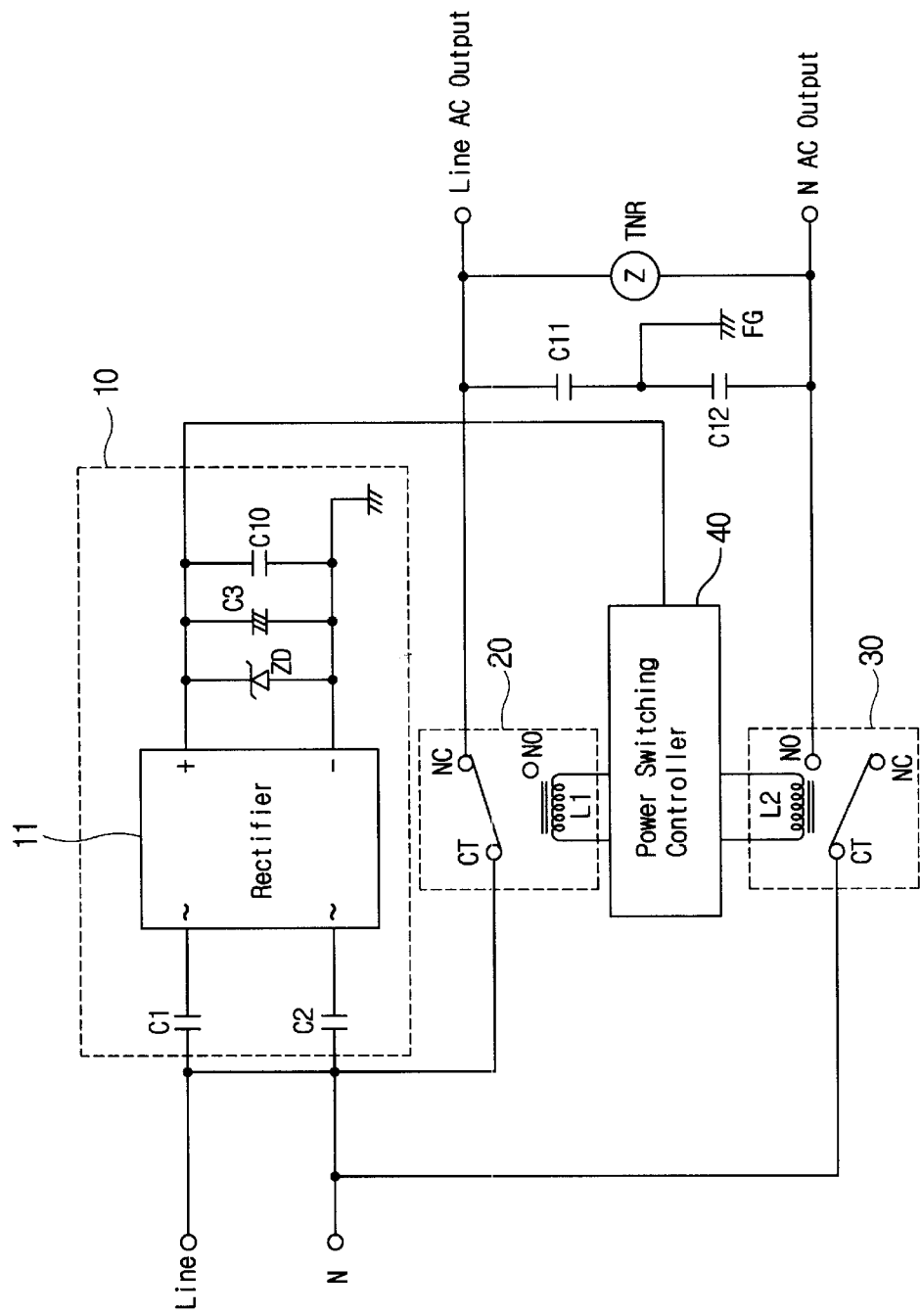
FIG. 1 shows the circuit diagram of a device for the automatic shut-off of equipment's stand-by power according to the preferred embodiment according to the invention.

FIG. 1 shows a circuit diagram for the arrangement of the device for the automatic shut-off of equipment's stand-by power according to a preferred embodiment of the invention. As is shown, this switching device comprises the first line Line and second line N for supplying the commercial alternating current AC, the first relay 20 for switching the contacts of the first line Line and the second relay 30 for switching the contacts of the second line N, and a power switching controller 40 for successively switching the contacting states of the first and second relays 20 and 30 depending on the presence/absence of the light after detecting it to thereby switch on or off the commercial alternating current AC through the first and second lines Line and N.

The arrangement of the invention is described in more detail below.

In the following description, the line Line carrying the commercial alternating current AC and the neutral line N will be designated as the first and second line Line and N. The first and second lines Line and N are connected to a wide range power supplying section 10, the first relay 20 and the second relay 30. The wide range power supplying section 10 is so arranged that the commercial alternating current AC may be always supplied regardless of the contacting states of the first and second relays 10 and 20.

The wide range power supplying section 10 which is supplied with the commercial alternating current AC (which will be briefly referred to as an alternating current in the following) supplies in turn a driving power at a low voltage level to a power switching controller 40. This wide range power supplying section 10 may be replaced by a storage battery not shown. This power supply to the controller 40 represents the driving power for this device, that is, this power acts to reverse the switching, when the alternating current AC through the first and second lines has been cut off by the controller 40.

The switching controller 40 is driven by the direct current at a low level from the wide range power supplying section 10 which is composed of a plurality of capacitors C1 and C2, a rectifier 11 and a zener diode ZD. The capacitors C1 and C2 are each connected in series in the first line Line and second N and they have an electrostatic capacity in such a manner that a constant voltage results irrespective of the level of alternate current.

The alternating current induced at the capacitors C1 and C2 is rectified by a rectifier 11 and the rectified direct current is maintained at a constant low level by the zener diode ZD which is connected in a parallel manner across the output terminals. Capacitors C3 and C4 are used to remove the ripple components. The direct voltage which is maintained at a low voltage depending on the basic potential level of the zener diode is used as the driving power for the switching controller 40. The switching controller 40 which is driven by the driving power generated in the power supplying section 10 serves to switch the contacting states of the first relay 20 and the second relay 30 depending on the presence/absence of the light.

For example, in the case of existing surrounding light, the switching controller 40 operates the respective contacting states of the first and second relays 20 and 30 to connect the contact terminals CT with the normal close terminals NC so that the line alternating current Line AC and the neutral line current N AC are output. The capacitors C11 and C12 which are connected in a parallel manner between the line alternating current Line AC and the neutral alternating current N AC before the output are full-grounded FG to remove the noise interfered in the entering alternating current AC. The TNR connected parallel is to absorb and remove the noise infiltrating in the input or output terminal.

On the other hand, when the light is not detected by the switching controller 40, the contacts of the first and second relays 20 and 30 are operated to connect the contact terminals CT to the normal open terminals NO and therefore the line alternating current and the neutral alternating current through the first and second line are interrupted.

Figure 2:
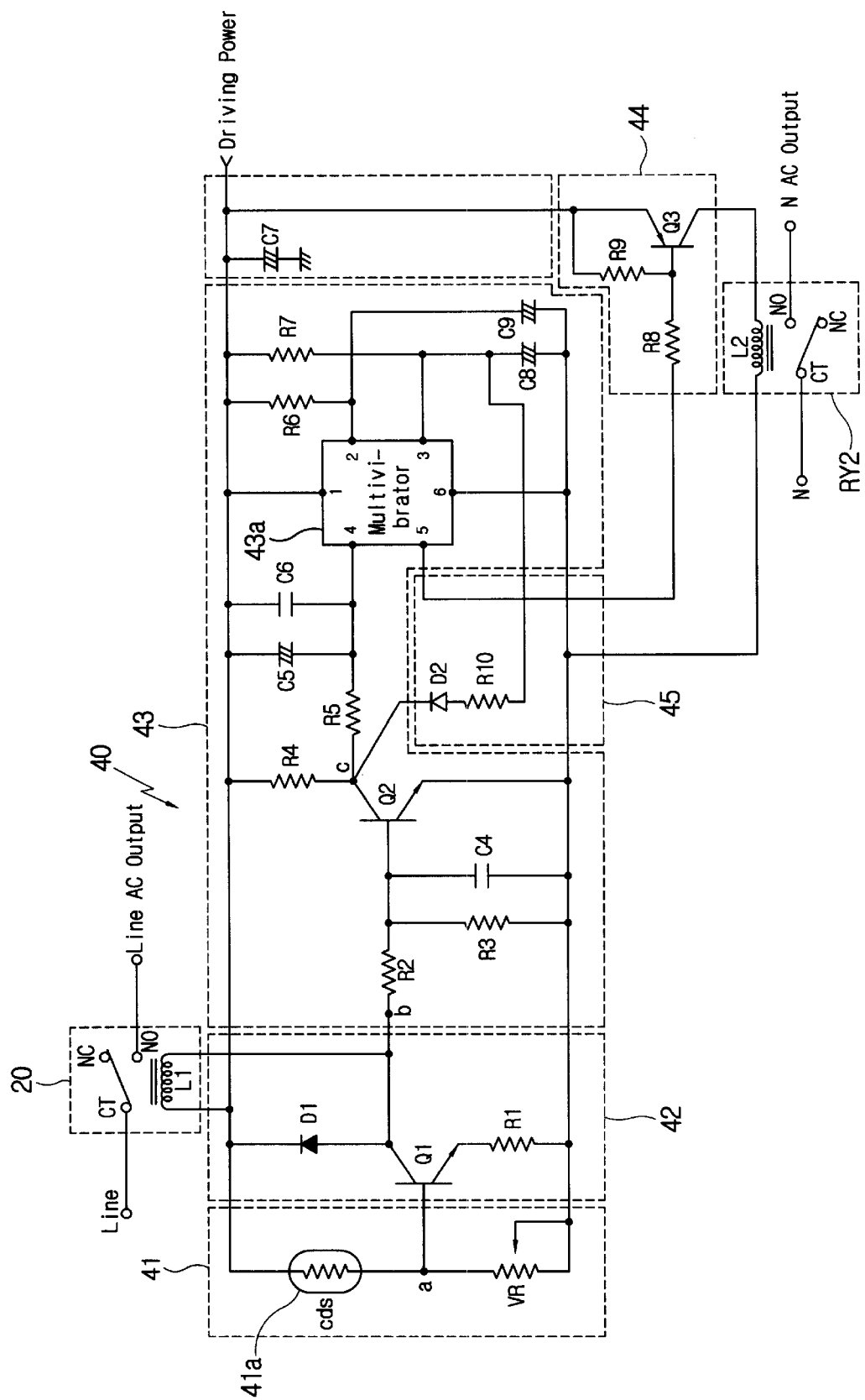
FIG. 2 shows the circuit diagram of the device for the automatic shut-off of equipment's stand-by power depicted in FIG. 1.

The arrangement of the power switching controller 40 which acts to open and close the first line Line and the second line N by driving the first relay 20 and the second relay 30 depending on the presence/absence of the detected light is described in more detail by referring to the attached drawings, particularly FIG. 2.

FIG. 2 is a circuit diagram of the power switching controller shown in FIG. 1. First, whether the light is present is detected by a sensor part 41, as seen in the drawing. As the sensor part 41 for detecting the light, a CdS element 41a as a photoconductive cell may be preferably used, although a CdSe element or a photodiode may instead be used. In the case a CdS element 41a is used for light detection, a variable resistance VR is connected in series with the element, wherein the sensitivity of the CdS element 41a is controlled by varying the resistance of the variable resistance VR. The variable resistance VR generates an electric current in proportion to the quantity of the light detected.

In particular, the current is not produced when it is dark without any light in the environment, while in case of the light existing, the current is produced in proportion to the quantity of the light to output the corresponding detection signal. According to the nature of the detection signal output from the CdS element 41a, the switching controller 40 switches over or maintains the contacting state of the first and second relays 20 and 30. First, for illustration, the operation of the first and second relays 20 and 30 will be described, when it is transited from the daytime to the deep night or a non-service time for using electric or electronic appliances.

When the surrounding light gets to vanish from the state wherein the contacting terminals CT of the first and second relays 20 and 30 are each in connection with the normal close terminals NC, no current results at the node a due to the inactivation of the CdS element 41a. Thus, the transistor Q1 of the driver 42 for the first relay is inactivated. This inactivation causes the current in the coil L1 of the first relay 20 to be demagnetized, whereby the contact is switched from the NC over to NO terminal to open the first line. The diode D1 in parallel connection with the coil L1 for switching contacts serves as the reflux diode to protect the transistor Q1 and the hesitance R1 is also used as the emitter resistance.

When the transistor Q1 is inactivated, no current flows at the node b and accordingly the transistor Q2 is inactivated. The voltage which is to inactivate the transistor Q2 results at the resistance R2 and then is applied to the transistor Q2 through a resistance R3 and a capacitor C4. The inactivation of the transistor Q2 leads to the low voltage resulting at the node c. This voltage is applied to the terminal 4 of a multivibrator 43a as a trigger signal through a resistance R5 and capacitors C5 and C6.

The multivibrator 43a for which a monostable multivibrator is usually used is supplied with the driving voltage at the power terminal 1, which voltage originated from the wide range power supplying section 10 and was freed of noise through a capacitor C7. The low level driving pulses the width of which depends on the time constant determined by the resistance R6 and the timing capacitor C9, connected to the terminal 2, are output at the output terminal 5. In other words, the driving signal which depends on the trigger pulses input to the terminal 4 is output at the terminal 5 in such a manner as regulated by the combined dimension of the resistance R5 and condenser C9.

Thus, the driving pulses are output from the multivibrator 43a after the delay of a predetermined time from the inactivation of the transistor Q1 in the course of its output through the transistor Q2 and the multivibrator 43a. These driving pulses delayed by a predetermined time are at such a high potential that the driver 44 for the second relay 30 or RY2 can perform switching operation of the contacts of the second relay. In other words, this second relay driver 44 opens the second line N by switching the state of contact in the second relay from the connection between the contact terminal CT and the normal close terminal NC to that between the contact terminal CT and the normal open terminal NO.

The second relay driver 44 for opening the second or neutral line N by switching the contacts of the second relay 30 comprises a transistor Q3. The transistor Q3 leads to inactivation due to the driving pulse, which has been brought to naught through a high resistance R8 from its original high level, and accordingly no current results in a coil L2 of the second relay 30 to cause demagnetization. Here, the resistance R9 is used as a collector feedback bias. The demagnetization of the coil L2 by cutting the current leads to the connection of the contact terminal CT of the second relay 30 with the normal open terminal NO, whereby no alternating current occurs in the second line N.

The multivibrator 43a which supplies a driving pulse to the transistor Q3 is reset to its original state every time a driving pulse has been output. To obviate this situation, a resistance R7 for inducing driving power is connected to the reset output terminal 3 of the mulivibrator 43a and between this resistance R7 and the node c of the transistor Q2 there is additionally provided an automatic reset circuit 45 for feeding back the driving power resulting at the resistance R7.

The automatic reset circuit 45 yields a low voltage by dividing the driving voltage through the resistances R7 and R10 and flattens through a diode D2 before feeding to the node c. A capacitor C8 is used for removing noise. The low voltage resulting at the node c is supplied to the terminal 4 of the multivibrator 43a, wherein the driving pulses are successively generated to keep the second relay 30 in contacted state. For example, when the light is not detected at the CdS element 41a, the switching controller 40 opens the first line Line and the second line N to prevent the alternating current AC from being output. In case that the light is detected at the element 41a on the contrary, the switching controller 40 switches the contacting states of the first and second relays 20 and 30 to permit the output of current through them.

When the CdS element 41a now detects the light to reverse the state of the first and second relay 20 and 30, the element generates a detection signal. The generation of detection signal leads to a high level current at the node a which current activates the transistor Q1 to produce an excited state in which a current occurs in the coil L1. The coil L1 in excited state causes the contact state of the first relay 20 to connect the contact terminal CT to the normal close terminal NC, whereby alternating current is output through the first line Line.

The activation of the transistor Q1 which switches the contact of the first relay 20 causes a current at the node b to activate the transistor Q2. The activation of the transistor Q2 in turn causes the generation of low voltage at the node c which voltage is applied as a trigger signal to the multivibrator 43a to thereby supply a low potential driving signal to the transistor Q3, which is then activated. The activated transistor Q3 brings the coil L2 of the second relay 30 into an excited state, whereby the contact terminal CT of the second relay 30 is switched to the normal close terminal NC to allow an alternating current in the second line N.

As described above, the power switching controller 40 sequentially opens or closes the first Line and second line N depending on the light detection by the CdS element to protect against a danger which could be caused by a simultaneous opening or closing of the first and second lines as alternating current carriers and in addition limits the output of the alternating current through the two lines Line and N. In other words, the CdS element 41a causes the alternating current to be output through the first line Line and the second line N by means of the switching controller 40 in the daytime for example when the detection signal is present, while the alternating current through the first line Line and the second line N is prevented from being output in the night time when the light is not detected.

The CdS element distinguishes the day from the night depending on whether the light is present, and when distinction between the day and the night is determined by the CdS element, the switching controller 40 permits or prohibits the current to electric and electronic appliances upon that distinction. That is, the power switching controller 40 is automatically switched, so that the alternating current through the first line Line and the second line N may be permitted in the daytime, and the current may not be output in the night time.

Figure 3:
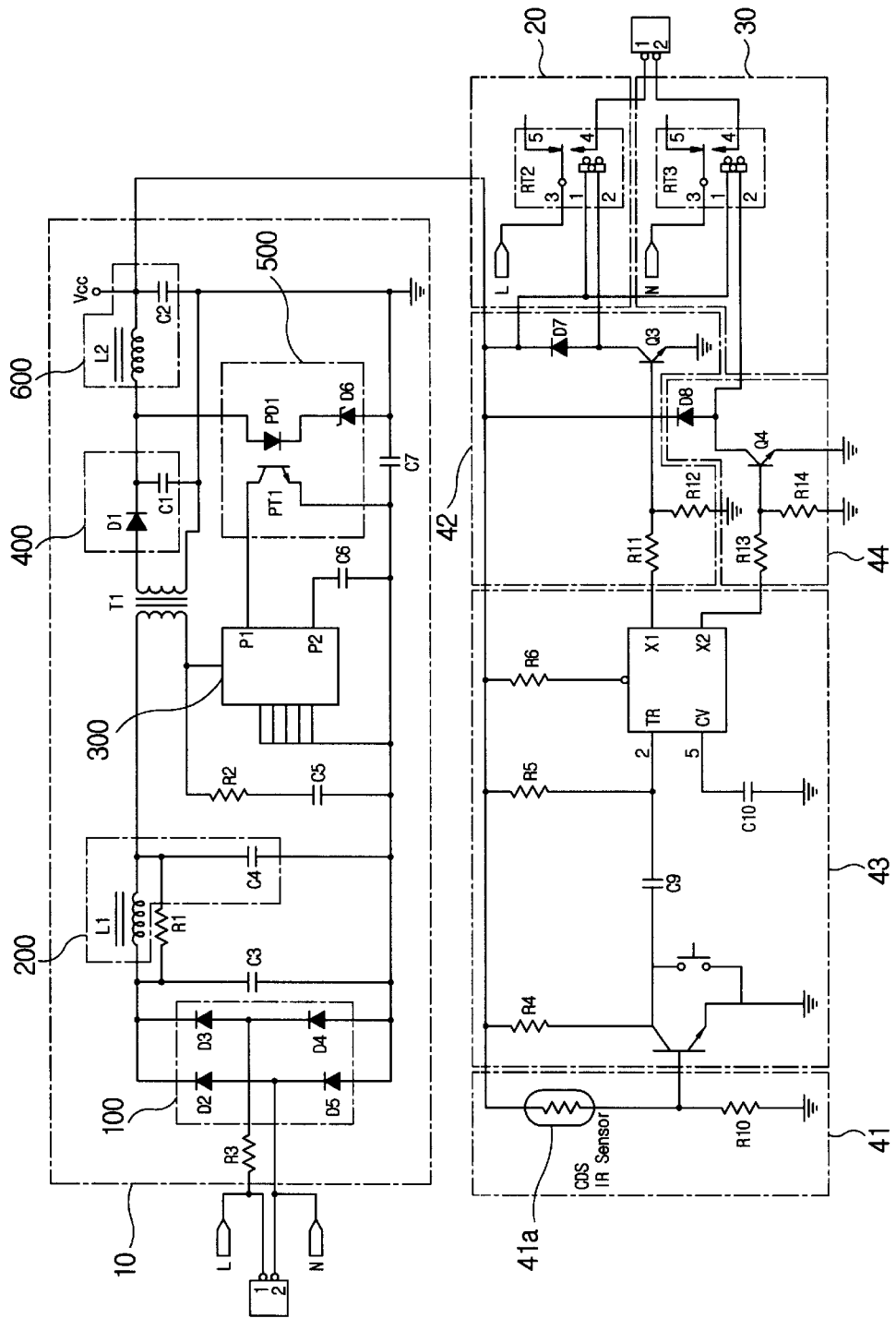
FIG. 3 shows the circuit diagram of a device for the automatic shut-off of equipment's stand-by power of the another preferred embodiment according to the invention.

Also, as shown in FIG. 3 which is the circuit diagram of a device for the automatic shut-off of equipment's stand-by power of the another preferred embodiment according to the invention, the wide range power supplying section(10) in this invention can be composed of a AC-DC converting portion(100) which converts an input commercial alternating current(AC) into direct current(DC) by full-wave rectification with bridge diodes(D2~D5); a noise filtering portion (200) which eliminates line noises of the direct current(DC) made in the above; a current and voltage detecting portion (500) which detects the current and voltage to be provided; a pulse width(duration) modulation and driver portion(300) which generates signal for pulse width modulation(PWM signal) according to the output of the current and voltage detecting portion(500); a DC ripple filtering portion(400) which smoothes a direct current(DC) through a transformer (T1) receiving direct current(DC) from a first coil and transmitting the direct current(DC) to a second coil; and a radio frequency(RF) filtering portion(600) having an inductance(L2) and a condenser(C2), eliminating high-band element of direct current(DC) issued from the direct current (DC) ripple filtering portion(400).

As described above, the power switching device according to the present invention can automatically supply or cut off the alternating current to electric and electronic appliances by the means of the CdS element depending on the daytime or the night time and so has the advantage of reducing the waiting power consumption.

It is to be understood that, while the invention was described with respect to a specific embodiment, the invention is never restricted to that embodiment and a variety of modifications or alterations and applications would be possible to a man skilled in the art by referring to the description or drawings presented here and within the spirit of the invention and thus those modifications are to fall within the scope of the invention, which scope should be limited only by the attached claims.

What is claimed is:

1. A device for the automatic shut-off of equipment's stand-by power including a first and second fine for a commercial alternating current;
   a first relay for switching contacts of the first line;
   a second relay for switching contacts of the second line; and
   a power switching controller for detecting whether a light is present and for sequentially switching the contact states of the first relay and second relay depending on the result of the light detection to thereby allow or cut off the commercial alternating current through the first and second lines, which comprises:
      a sensor section for detecting whether the light is present and for generating and outputting a detection signal when the light is present;
      a first relay driver for being activated in the case of no reception of the detection signal to switch the contact states of the first relay so that the commercial alternating current is not output through the first line;
      a delay section for generating and outputting driving pulses after a delay of predetermined time following the activation of the first relay driver, and
      a second relay driver for being activated upon the reception of driving pulses to switch the contact states of the second relay so that the commercial alternating current is not output through the second line.

2. The device for the automatic shut-off of equipment's stand-by power according to claim 1, wherein said sensor section employs a CdS element or photodiode which can detect whether the light is present and output a signal, and is also provided with a variable resistance in series with said CdS element or photodiode to adjust the sensor section's sensitivity.

3. The device for the automatic shut-off of equipment's stand-by power according to claim 1, wherein said delay section comprises:
   a transistor for outputting the activated stale of the first relay driver after a delay of predetermined time; and
   a multivibrator for being triggered by the activation of said transistor to output driving pulses.

4. The device for the automatic shutoff of equipment's stand-by power according to claim 1, wherein said delay section further comprises an automatic reset part to maintain the driving pulses in the state of continuous output.

5. A device for the automatic shut-off of equipment's stand-by power including first and second lines for providing electrical current, the device comprising:
   a first relay connected between the first line and a first power input of the equipment for switching contacts of the first line;
   a second relay connected between the second line and a second input of the equipment for switching contacts of the second line; and
   a power switching controller connected to the first and the second relays and controlling the first and second relays in response to sensing of a light wherein the first and the second relays are sequentially controlled by the power switching controller.

6. The device of claim 5, wherein the power switching controller is energized from the first and the second lines.

7. The device of claim 5, wherein the power switching controller comprises:
   a sensor section for detecting whether the light is present and for generating and outputting a detection signal when the light is present;
   a first relay driver for being activated in the case of no reception of the detection signal to switch the contact states of the first relay so that the commercial alternating current is not output through the first line;
   a delay section for generating and outputting driving pulses after a delay of predetermined time following the activation of the first relay driver; and
   a second relay driver for being activated upon the reception of driving pulses to switch the contact states of the second relay so that the commercial alternating current is not output through the second line.

8. The device of claim 7, wherein the sensor section employs at least one of a CdS element and photodiode which can detect whether the light is present and output a signal, and is also provided with a variable resistance in series with the CdS element or photodiode to adjust the sensor section's sensitivity.

* * * * *